United States Patent [19]

Rice et al.

[11] Patent Number: 5,283,844
[45] Date of Patent: Feb. 1, 1994

[54] MONOLITHIC ACTIVE WAVEGUIDE OPTICAL CROSSBAR SWITCH

[75] Inventors: Robert R. Rice, Chesterfield; Mark S. Zediker, Florissant; Chester L. Balestra, Ellisville; Allen Priest, University City, all of Mo.

[73] Assignee: McDonnell Douglas Corporation, St. Louis, Mo.

[21] Appl. No.: 846,578

[22] Filed: Mar. 5, 1992

[51] Int. Cl.⁵ .............................................. G02B 6/26
[52] U.S. Cl. .................................... 385/17; 385/16; 385/44; 385/45
[58] Field of Search ................... 385/17, 16, 18, 44, 385/45

[56] References Cited

U.S. PATENT DOCUMENTS

| 4,521,069 | 6/1985 | Ikeda | 385/17 X |
| 4,737,003 | 4/1988 | Matsumura et al. | 385/17 |
| 4,932,735 | 6/1990 | Koai | 385/17 |

Primary Examiner—Rodney B. Bovernick
Assistant Examiner—Stephen W. Barns
Attorney, Agent, or Firm—Guy R. Gosnell; Benjamin Hudson, Jr.; Timothy H. Courson

[57] ABSTRACT

A semiconductor active waveguide optical crossbar switch to allow optical signals to be routed to any number of ports with no net attenuation of signal strength. The optical crossbar switch is comprised of a network of optical waveguides wherein both lateral and transverse carrier confinement is provided. Redirection of the optical waveguide is accomplished by means of total internal reflectance turning mirrors. Furthermore, the optical waveguides are formed such that electrical current may be applied to the semiconductor structure to amplify the optical signal travelling therein. Electro-absorption switches formed from distinct metallic contacts overlying portions of the optical waveguides amplify the optical signal travelling through the waveguide underneath the switch if sufficient electrical stimulation is applied to the switch. Additionally, if no stimulation is applied to the electro-absorption switch, the optical signal travelling in the portion of the optical waveguide beneath the electro-absorption switches is attenuated to a level below that of the noise in the optical system such that no signal will be received by the output. Thus, by appropriately patterning the optical waveguide network in conjunction with turning mirrors and metallization contacts to provide attenuation or amplification, an input optical signal applied to this semiconductor active waveguide optical crossbar switch may be directed to any number of output ports. By utilizing optical signals throughout the design with no conversion to electrical signals, the transmission bandwidth of the switch is very large and the switching network is impervious to EMI.

20 Claims, 3 Drawing Sheets

MONOLITHIC ACTIVE WAVEGUIDE OPTICAL CROSSBAR SWITCH

BACKGROUND OF THE INVENTION

This invention relates generally to optical crossbar switches and more particularly to reconfigurable monolithic optical crossbar switches capable of amplifying or attenuating the switched signals.

In numerous applications, such as high computation rate parallel or distributed computing architectures with numerous processors which transmit information to each other or share common resources, communication switching systems as in telephone switching centers, and aircraft fiber optic buses that require reconfigurability to allow for redundancy for fault tolerance as well as the ability to share several sensors with each of several processors it is desirable to utilize a reconfigurable interconnection network. One such type of reconfigurable interconnection network is a reconfigurable crossbar switch which is in effect an N×M array of switches for connecting each of N inputs for any or all of M outputs.

Initially, electrical crossbar switches were developed and utilized, however, the use of such electrical switches severely limits the bandwidth of the signals transmitted through the switch as well as being quite sensitive to electromagnetic interference (EMI). Additionally, electrical crossbar switches generate EMI themselves. With the advances of speed and volume in data communications, the limitations imposed by electrical crossbar switches have proven to be too constraining and reconfigurable interconnection networks including optical switches or hybrid electrooptical switches have been developed.

Optical or hybrid electrooptical crossbar switches have significantly improved the transmission bandwidth in comparison with electrical crossbar switches as well as reducing the effects of EMI on the switch. Several methods have been utilized in attempts to design optical interconnection networks. One such design involves the electrical detection of an optical signal followed by relaying the transduced electrical signal to the appropriate channel and regeneration of the optical signal at the appropriate output optical channel. Such a process, however, is prone to the introduction of errors during conversion as well as during the relaying processes. Additionally, bandwidth is still limited to the bandwidth of the device electronics and transmission via an electrical signal path can take place in only one direction as opposed to bidirectional optical transmission.

An alternative optical interconnection network is a passive optical transmission path crossbar switches in which an input optical signal is made available to N output ports with the particular output port subsequently selected. Such an optical interconnection network, however, suffers from several deficiencies. In addition to the typically massive size of such systems, the signal in such a device is reduced in strength by a factor of N due to the splitting of the signal in order to make it available to each of the N output ports.

Yet another approach to developing an optical interconnection network is illustrated by the networks disclosed in U.S. Pat. No. 5,037,173 issued on Aug. 6, 1991. In the optical interconnection network discussed in the 5,037,173 patent bifurcated optical fibers with a common end for both emitting light and receiving light are positioned such that light may be emitted from the fibers toward a spatial light modulator which reflects the input light to the desired fiber through which it is to be output. Additionally, the patent discloses the use of a deformable mirror device for reflecting the input light to the desired output fiber. While the optical interconnection network disclosed by the 5,037,173 patent may allow transmission of signals having a wide bandwidth while not being impeded by EMI, such an optical interconnection network must be aligned precisely in order to operate properly and may prove difficult to fabricate.

It would be desirable therefore, for an optical interconnection network to be designed that can provide a high level of signal splitting without signal corruption or loss in bandwidth. Furthermore, it would be desirable for such an optical interconnection network to be bi-directional and to be capable of being fabricated by conventional integrated circuit fabrication techniques with a high level of crossbar function integration on a single monolithic chip. It would also be desirable for the optical interconnection network to be easily reconfigurable to assure system architectural flexibility and fault tolerance.

SUMMARY OF INVENTION

There is provided by this invention a semiconductor active waveguide optical crossbar switch to allow optical signals to be routed to any number of ports with no net attenuation of signal strength. The optical crossbar switch is comprised of a network of optical waveguides. The optical waveguides are typically formed from a plurality of semiconductor layers having therein a single quantum well between a pair of graded index confinement layers. The optical waveguides require lateral confinement as well, typically implemented by a rib waveguide construction such that the optical signals propagate within the quantum well region located beneath the rib. Redirection of the optical signals along the optical waveguide is accomplished by means of total internal reflectance turning mirrors in which a portion of the waveguide along with the surrounding semiconductor layers are etched to a point beneath the single quantum well and confinement layers such that optical signals arriving at this etched facet are redirected. Furthermore, the optical waveguides are formed such that metallization layers may be applied to the opposing major faces of the semiconductor structure such that electrical current may be applied to the semiconductor structure to amplify the optical signal travelling therein. The metallization layer may be patterned such that separate contact may be made with each optical waveguide. Electro-absorption switches formed from distinct metallic contacts overlying portions of the optical waveguides amplify the optical signal travelling through the waveguide underneath the switch if sufficient electrical stimulation is applied to the switch. Additionally, if no stimulation or a negative bias is applied to the electro-absorption switch, the optical signal travelling in the portion of the optical waveguide beneath the electro-absorption switches is attenuated. If the length of the electro-absorption switch is sufficiently long, the attenuation reduces the signal strength to a level below that of the noise in the optical system such that no signal will be received by the output. Alternatively, the signal may be reduced in strength below the noise level with a shorter electro-absorption switch if the switch is electrically reverse biased. Thus, by appropriately patterning the optical waveguide network in conjunction with turning mirrors and metallization contacts to provide attenuation or amplification, an input optical signal applied to this semiconductor active waveguide optical crossbar switch may be directed to any number of output ports. Additionally, with the use of a sensor and a controller, the incoming signals may dictate the configuration of the network and their ultimate destruction. By utilizing optical signals throughout the design with no conversion to electrical signals, the transmission bandwidth of the switch is very large and the switching network is impervious to EMI. While such an optical crossbar switch may be made to any N×M size, typical sizes of such crossbar switching networks are 2×2, 4×4, 8×8, and 16×16 networks.

DETAILED DESCRIPTION OF THE PREFERRED EMBODIMENT

Figure 1:
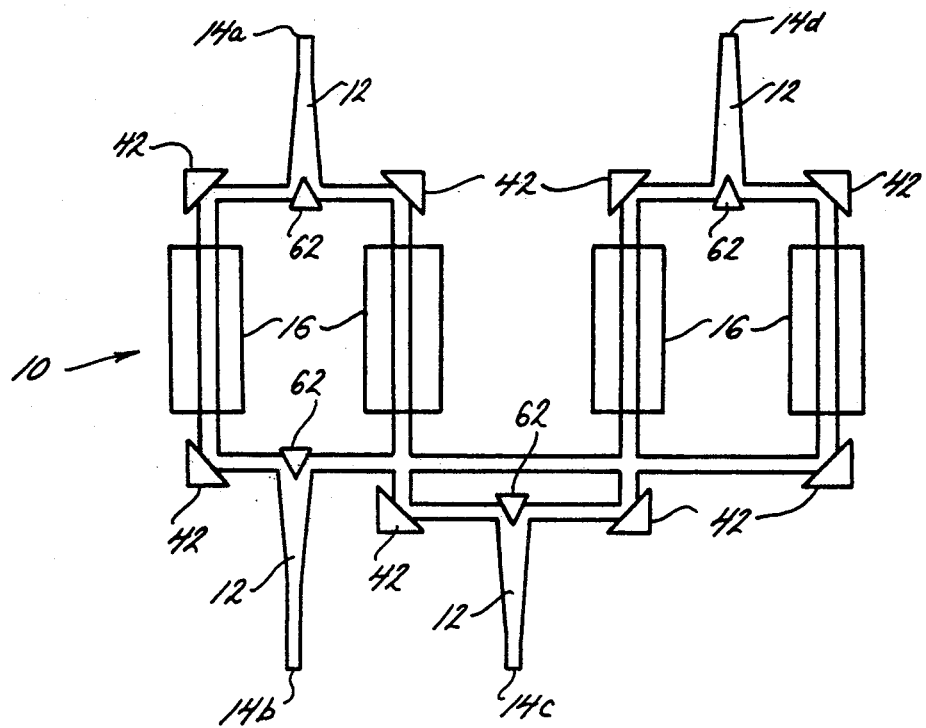
FIG. 1 is an exemplary plan view of a 2×2 semiconductor waveguide optical crossbar switch incorporating the principles of this invention.

Referring to FIG. 1, there is shown an exemplary plan view of a semiconductor active waveguide optical crossbar switch 10 allowing signals to be routed between various input and output ports which illustrates the potential optical paths and switches. The semiconductor active waveguide optical crossbar switch 10 is comprised of a plurality of components each of which will be subsequently described. There is shown in FIG. 2, a sectional side view of a semiconductor structure 20 which typically forms the optical waveguides and amplifiers of the semiconductor active waveguide optical crossbar switch 10.

While the semiconductor structure may be comprised of any of a variety of materials and the physical dimensions of the semiconductor structure also varied, as is well known to those skilled in the art, a gallium arsenide (GaAs) semiconductor structure will be described in more detail as an example. Additionally, while the semiconductor structure may be comprised of any of a variety of layers such that vertical, or transverse, confinement and lateral confinement of the propagating light is achieved, it is preferable if the semiconductor structure is designed such that the energy band gap is a minimum and the index of refraction is a maximum in the active region. The minimization of the energy band gap in the active region is preferable so as to optimize hole-electron recombination while the maximization of the index of refraction in the active region is desirable to provide vertical optical confinement. As an exemplary structure, a graded index single quantum well structure is described in detail although multiple quantum well structures or structures having a broad active region could be used as well. Also, the graded index layers are only one manner of achieving vertical confinement and others may be utilized as is well known to those skilled in the art. The exemplary GaAs semiconductor waveguide structure 20 shown in FIG. 2 is fabricated on an N+ doped GaAs substrate 22 upon which an N-doped AlGaAs cladding layer 24 is deposited. Upon the N-doped AlGaAs cladding layer 24 is deposited a pair of graded index confinement layers 26 surrounding a single quantum well 28 forming a graded index separate confinement heterostructure (GRIN-SCH). In this GRIN-SCH region, the graded index confinement layers 26 have varying percentages of aluminum and gallium comprising their composition of $Al_xGa_{1-x}As$. The confinement layers 26 have a percentage of aluminum that decreases as the layer approaches the interface of the confinement layer and the quantum well. Thus, at the interface of the cladding layer, and the confinement layer the percentage of aluminum in the confinement layer is equal to that in the cladding layer. The percentage of aluminium then decreases in a direction towards the quantum well region.

The quantum well 28 is formed with GaAs such that it has a smaller energy gap and a higher refractive index than the graded index confinement layers 26 bounding it so as to confine the carriers within the quantum well 28 to increase the waveguide's efficiency. Upon the quantum well 28 and second graded index confinement layer 26b is deposited a P-doped AlGaAs cladding layer 30. A P+ doped GaAs layer 32 is subsequently deposited upon the P-doped AlGaAs cladding layer 30. Through conventional photolithographic etching, a rib or ridge of P+ GaAs and P-doped AlGaAs layers is defined upon which a dielectric layer 34 is deposited. The dielectric layer 34 is subsequently etched such that the P+ GaAs layer 32 is exposed upon the top of the ridge. Subsequently, metallization layers 36 are applied to both major surfaces of the semiconductor structure such that the electrical contact can be maintained.

Figure 2:
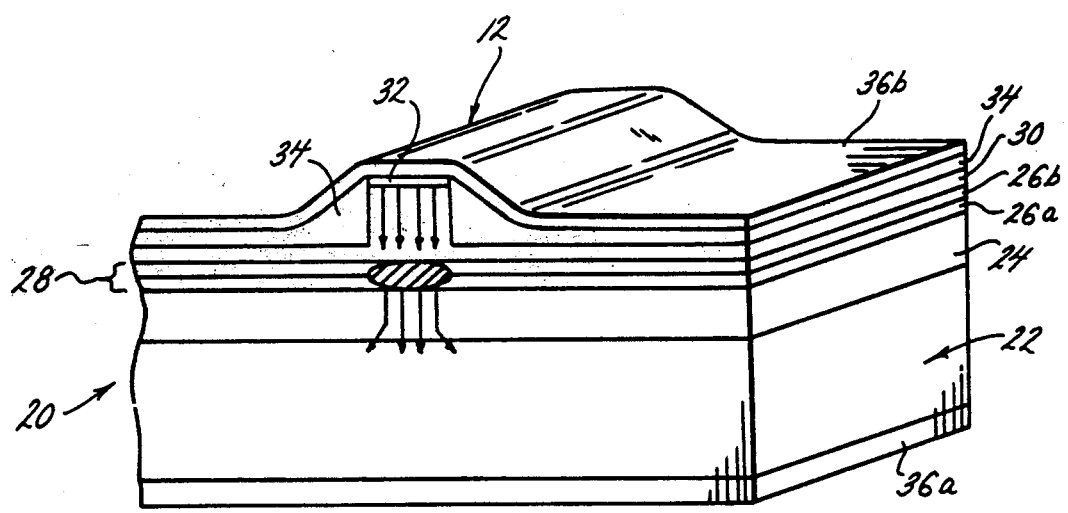
FIG. 2 is a cross sectional view of a active optical waveguide formed of a plurality of semiconductor layers.

While the semiconductor structure 20 depicted in FIG. 2, was described in terms of construction utilizing GaAs and AlGaAs, similar structures can be formed from a variety of optically active III-V, II-V, II-VI and IV-VI semiconductor materials as well known to those skilled in the art. Examples of alternative materials systems for use in various wavelength spectra include the use of alloys of Indium Gallium Arsenide (InGaAs) for propagating light having a wavelength from 900 nm to 1100 nm; alloys of Indium Gallium Arsenide Phosphide (InGa As P), typically deposited or Indium Phosphide (InP) substrates, for propagating light having wavelength from 1300 nm to 1600 nm; alloys of Indium Arsenide Antimonide (InAsSb) for propagating light having a wavelength from 2000 nm to 5000 nm; and alloys of II-VI materials for propagating visible light having a wavelength of 450 nm to 650 nm. The semiconductor structure, however, must operate as a single, lowest order mode optical waveguide so that it is not bandwidth limited by multi-mode signal distortion. Additionally, as previously discussed, a semiconductor structure regardless of particular materials utilized and the sequence of layers deposited thereupon, should be grown to form a structure in the vertical direction that: 1) has a P-N junction in the vertical direction, 2) confines the optically amplified signal to the P-N junction by means of grading the refractive index to maximum at the junction, and 3) attracts and confines both electrons and holes to the junction by means of achieving a minimum energy band gap at the junction. Lateral optical confinement may also be accomplished by any number of structural configurations in addition to the rib structure described in detail herein. While the rib structure provides lateral optical confinement due to the presence of a slightly higher refractive index in the area underneath the rib than that on either side of the rib, such lateral confinement may also be obtained with other semiconductor waveguide configurations such as etched grooves, typically V-shaped between adjacent waveguides, the introduction of materials having lower indices of refraction between adjacent waveguides, or by the introduction of impurity induced disordering in the portions of the active layer laterally adjacent to the desired optical waveguide, as is well known to those skilled in the art. The structure 20 shown in FIG. 2 and described heretofore accomplishes each of these objectives with vertical confinement accomplished by means of the graded index structure 26 surrounding the single quantum well 28 and lateral optical confinement provided by means of the rib structure 12.

The waveguide structure 20 illustrated in FIG. 2 has metallization layers 36 on both major surfaces of the structure 20 such that current may be introduced between the metallization layers 36 as is well known to those skilled in the art. With no bias or a reversed bias applied to the rib structure, the semiconductor waveguide attenuates a travelling optical signal. However, with an appropriate amount of current supplied between the metallization layers 36, the optical path becomes transparent, i.e. having a unity gain. With increased levels of current supplied, the optical waveguide becomes an optical amplifier such that gain may be applied to the optical signal travelling therethrough. Thus, the semiconductor structure 20 shown in FIG. 2 may serve to extinguish, attenuate, pass or amplify an optical signal. The optical waveguide/amplifier structure 12 shown in FIG. 2 is utilized in the semiconductor active waveguide optical crossbar switch 10 shown in FIG. 1 to transmit, amplify or attenuate the optical signal.

Figure 3:
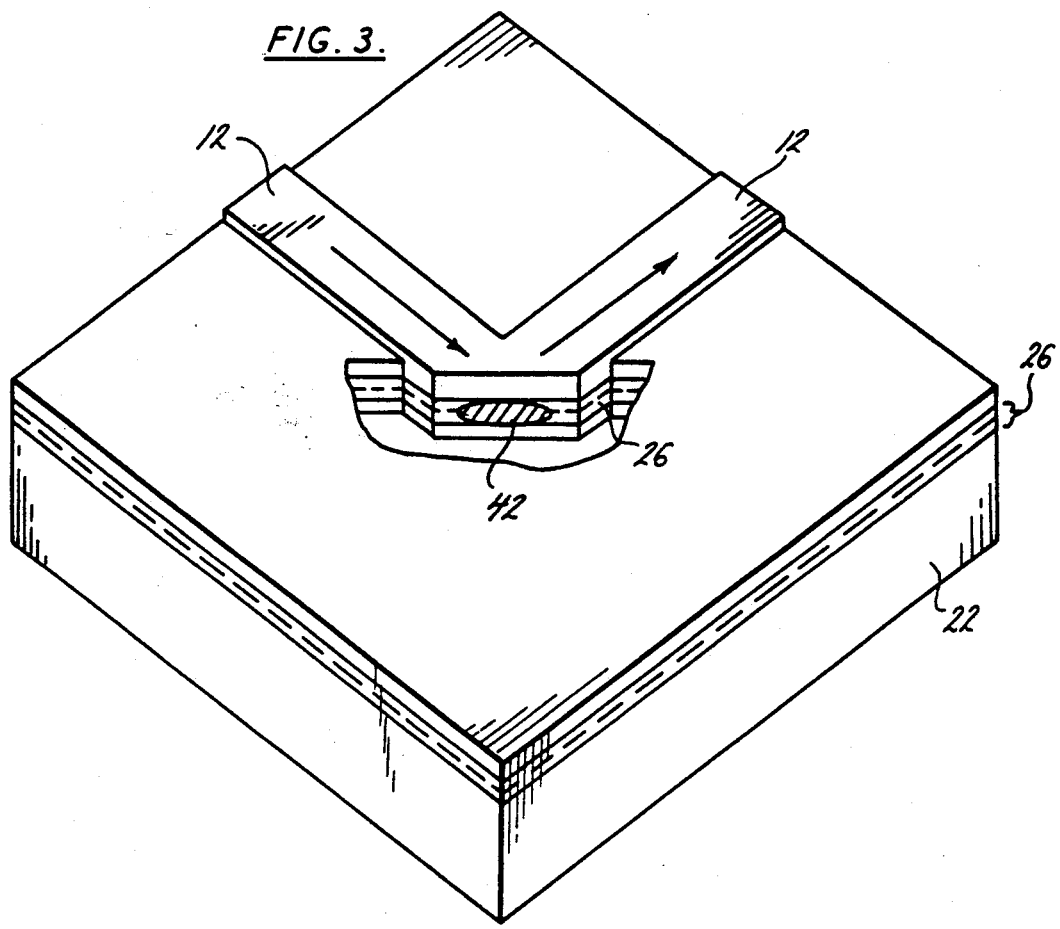
FIG. 3 is a perspective view of a waveguide turning mirror to redirect a travelling optical wave by means of total internal reflectance.

As shown in FIG. 1, redirection of a guided optical signal through the semiconductor active waveguide optical crossbar switch 10 is required in order to route the optical signal as needed. Such redirection may be accomplished by means of a total internal reflection (TIR) turning mirror 40 as shown in FIG. 3. To form such a turning mirror 40, the optical waveguides 12 required for the signal to travel are initially formed by deposition and etching upon the semiconductor substrate 22. Thereafter the mirror surface 42 may be formed by selectively etching a portion of the epitaxial layers along with a portion of the ribbed waveguide structure. The portion of the ribbed waveguide structure to be etched is that portion at which the reflection is to occur. The epitaxial layers and the ribbed waveguide structures are both etched to a point below the graded index structure 26 of the optical waveguide. The cavity 44 which has been etched from the semiconductor structure may be filled with a dielectric layer, such as $SiO_2$, or may be left empty. Such etching and selective patterning can be achieved by microelectronic photolithographic techniques followed by etching with a dry or wet etching process. The optical signal propagating through the optical waveguide is totally reflected from the etched facet 42, as shown in FIG. 3, due to the high index of refraction in the semiconductor device material in comparison to the material filling the cavity 44.

Redirection of a waveguide signal may also be achieved by means of gradually bending the waveguide while increasing the depth of the etch which forms the rib 12 and establishes the rib's height. Such bending is effective, however, only so long as the radiation mode losses which occur as the guided optical wave negotiates the bend in the waveguide do not excessively attenuate the guided signal.

Figure 4:
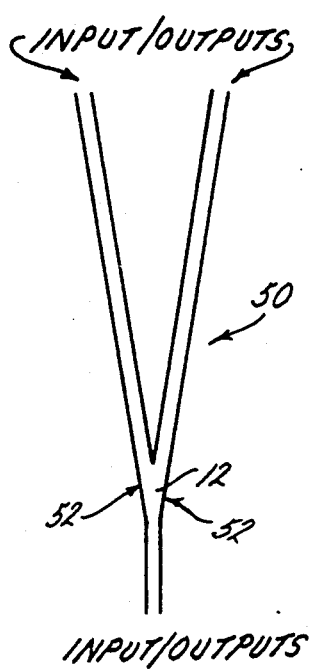
FIG. 4 is a plan view of a Y-branch for redirecting optical signals.
Figure 5:
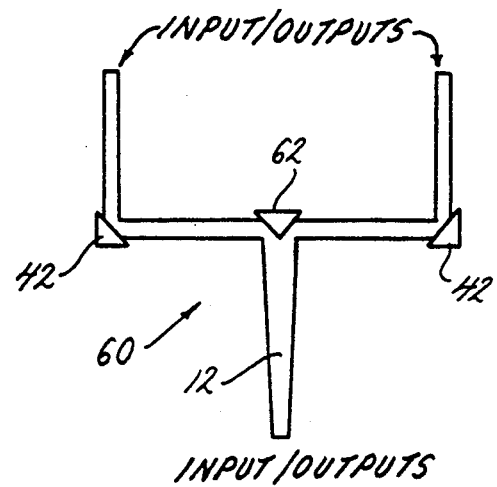
FIG. 5 is a plan view of a T-branch for redirecting optical signals.

Two typical configurations used to divide signals are a Y-branch structure 50 as shown in FIG. 4 or a T-branch structure 60 as shown in FIG. 5. In a Y-branch structure 50 as illustrated in FIG. 4, a guided wave is gradually widened and split into two or more signals. The splitting of the signals may be aided by process induced stress at the edge of the waveguide 12 which increases the refractive index at the edge 52 of the guide and thus, the mode strength along either edge of the waveguide 12.

As shown in FIG. 5, a T-branch 60 provides for gradual widening of a guided optical signal. The widened optical signal is thereafter redirected in two different directions as the widened signal strikes a double faceted splitting mirror 62 similar to those previously described and illustrated in FIG. 3. The optical signals may thereafter be redirected in any desired direction consistent with achieving total internal reflectance within the waveguide by means of two additional turning mirrors 42.

By propagating through N-stages of Y-and/or T-branches, a single optical signal may be split into as many as $2^N$ signal paths. Similarly, N-stages of Y-and/or T-branches may be utilized to channel N signal paths into one path by introducing the optical signals from the opposite end of the semiconductor structure since each of these structures function bi-directionally.

While redirection and splitting of optical signals is required for the functioning of an optical crossbar switch, such optical signal splitting results in resultant signals which are reduced in magnitude. For example, if an input optical signal is split into two portions of equal strength, each of these resultant portions is reduced by a factor of two relative to the original signal's power. Such an attenuation in signal strength, however, may be compensated for by the active waveguide portion of the semiconductor structure in which current may be introduced between the metallization layer 36 such that the signal is amplified to its original signal strength or to a greater level of signal strength if desired.

The operation of such a semiconductor active waveguide optical crossbar switch 10 may be illustrated by reference to FIG. 1. For example, an optical signal at port 14a may be connected with either or both of ports 14b and 14c, by means of the electro-absorption switches 16. Each electro-absorption switch 16 is a separately contacted portion of the semiconductor waveguide structure such that current introduced by the electro-absorption switch 16 electrically pumps the modulator section of the waveguide directly beneath the electro-absorption switch 16 into an "on" state so as to pass an optical signal propagating in the portion of the waveguide beneath the switch. If no current or a negative bias is applied to an electro-absorption switch 16, the portion of the waveguide beneath the switch operates to attenuate the optical signal. Thus, with a sufficiently long section of optical waveguide beneath an electro-absorption switch 16, a signal may become attenuated to a level substantially below the spontaneous emission noise background of the device and thus become obscured such that no signal is discernable after passing through the electro-absorption switch 16 in such an "off" state. By selecting which electro-absorption switches 16 are biased in an "on" or "off" state, the input optical signals may be routed to any one or a number of selected output ports. Additionally, when biased to an "on" state, the electro-absorption switch 16 may also provide gain to the optical signal should a sufficiently high level of current be applied to the switch 16. While electrical current has heretofore been discussed as supplying the required excitation for passing or amplifying an actively waveguided signal, the semiconductor optical amplifier may also obtain gain from optical pumping such that it may be controlled through optical stimulation by coupling light through the amplifying structure in a direction perpendicular to the waveguide.

The pattern of the metallization layers are such that each electro-absorption switches 16 is electrically distinct from every other electro-absorption switch 16 as well as from every metallization layer 36 which overlying the optical waveguides 12. Additionally, the metallization layers overlying each optical waveguide is typically fabricated so as to be electrically distinct from the metallization layers overlying every other optical waveguide on the monolithic structure as well as each electro-absorption switch 16. This metallization pattern is preferred since the gain or attenuation of each waveguide can then be individually controlled; however, if such control is unnecessary for the particular application, a single metallization layer over every waveguide may be used to simplify the fabrication process as long as the electro-absorption switches 16 are electrically distinct from the metallization layer 36 and every other switch 16.

Thus, as illustrated in FIG. 1, an input supplied to any one of the four ports 14 may be directed to either or both ports on the opposing side of the crossbar switch 10. Additionally, each optical path is bidirectional so signals may travel in either direction through the crossbar switch 10. Since such an optical crossbar switch 10 may be fabricated monolithically on a semiconductor structure 20, high levels of integration may be achieved by means of utilizing a larger network of active waveguides 12, turning mirrors 42, splitters 62, and electro-absorption switches 16 such as 4×4, 8×8, and 16×16 arrays of optical crossbar switches 10 in addition to the illustrative 2×2 crossbar switch shown in FIG. 1.

The optical crossbar switching network 10 as shown in FIG. 1 may also be reconfigured quickly by means of applying a different pattern of stimulation to the electro-absorption switches 16 so as to redirect or reroute any combination of input optical signals to any combination of output ports. The only delay in such reconfigurability is due to the inherent resistance and capacitance characteristics of the circuitry associated with the optical crossbar switch 10. Thus, reconfiguration times in nanoseconds are readily achievable.

Figure 6:
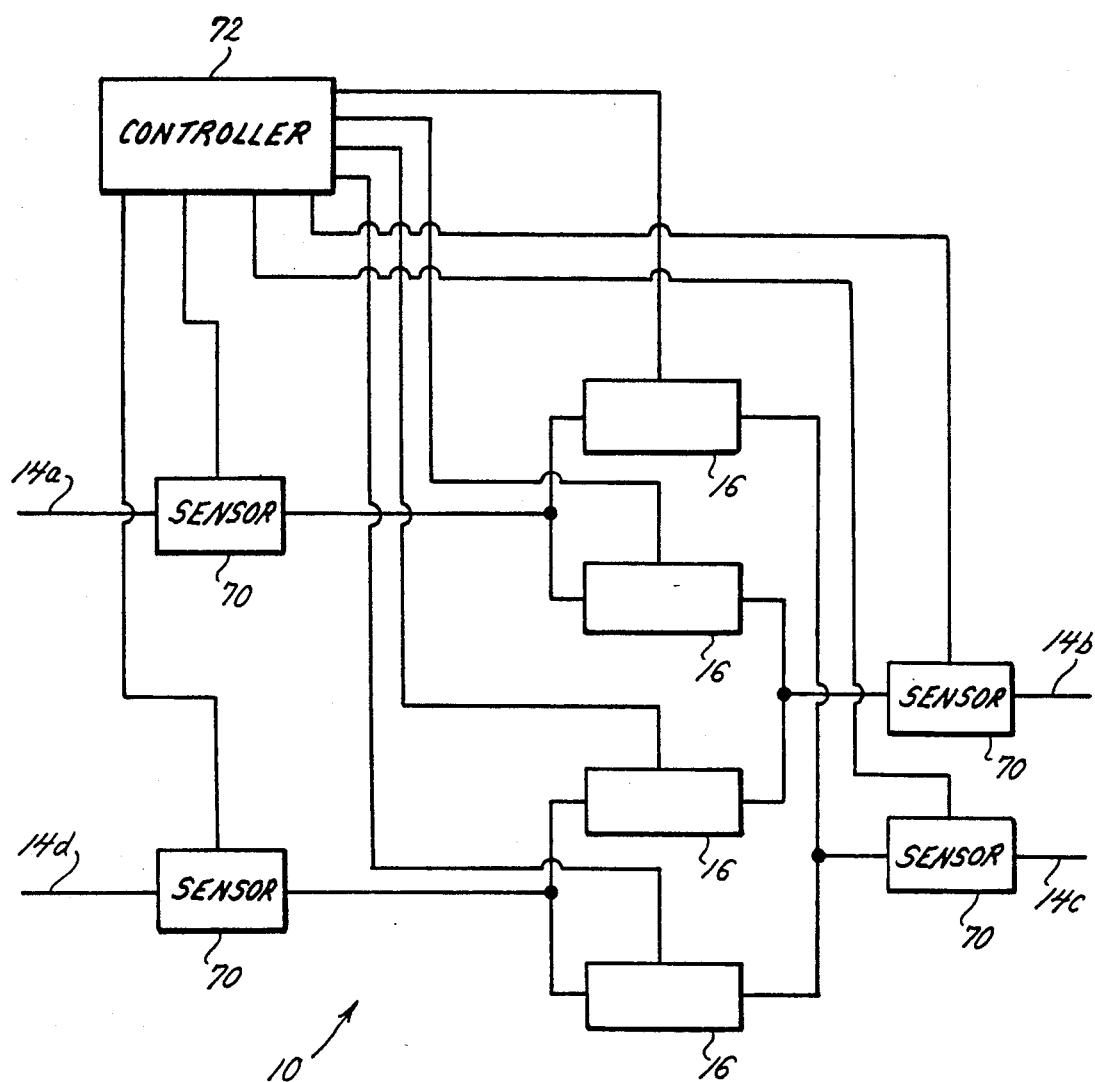
FIG. 6 is a block diagram illustrating a particular use of the optical crossbar switch.

An alternative use of such a switching network 10 is to utilize it in conjunction with a sensor 70 and a controller 72. The optical sensor 70 and the controller 72 are well known to those skilled in the art and are shown in FIG. 6. The sensor can measure the current or voltage of the incoming signals to a port 14. The controller 72 may then use the measured signal and based upon a predetermined set of instructions reconfigure the network to route the signals appropriately. Thus, the incoming signals may themselves control their destination.

While FIG. 1 illustrates the layout of the optical waveguides 12 for a monolithic crossbar switching network 10, optical signals may be coupled to or form the input/output ports 14 of the crossbar switch by means of optical fibers or microoptics as is well known to those skilled in the art.

Although there has been illustrated and described in specific detail instruction of operations, it is clearly understood that the same were for purposes of illustration and that changes and modifications may be made readily therein by those skilled in the art without departing from the spirit and scope of this invention.

What is claimed is:

1. An optical crossbar switch, comprising:
   a) a semiconductor substrate;
   b) a plurality of semiconductor layers, positioned upon said semiconductor substrate, having an active layer therein forming a semiconductor waveguide for propagating optical signals, said active layer having a first semiconductor layer of a first conductive type on a first side and a second semiconductor layer of a second conductive type on a second side, said first and second semiconductor layers having a greater and smaller refractive indices, respectively than said active layer to provide transverse confinement for the optical signals;
   c) interconnection means for connecting multiple sections of the semiconductor waveguide wherein said semiconductor waveguide forms a plurality of first ports and a plurality of second ports, said first and second ports capable of receiving and emitting optical signals, each first port being interconnected via the semiconductor waveguide with every second port; and
   d) a plurality of excitation means positioned along the semiconductor waveguide forming a switching means which interconnect each first port with each second port, each of said excitation means having a first on state in which energy is applied to said excitation means such that said optical signals may be transmitted in the active layer through said semiconductor waveguide underlying said switching means with no loss in signal strength and a second off state in which no energy is applied to said switching means such that said optical signal is significantly attenuated in the portion of said semiconductor waveguide underlying said switching means.

2. An optical crossbar switch, as recited in claim 1, wherein each of said switching means is formed from a distinct pad formed of a material having high electrical conductivity such that electrical contact may be maintained separately with each pad.

3. An optical crossbar switch, as recited in claim 2, wherein each of said semiconductor waveguides is overlaid with a layer of material having a high electrical conductivity such that electrical contact may be independently maintained forming an amplifying means within said semiconductor waveguides such that said optical signal propagating in the active layer may be amplified by injecting biasing current into the active layer.

4. An optical crossbar switch, as recited in claim 3, further comprising a plurality of splitting means for dividing each semiconductor waveguide, forming each of said first ports, into an equal number of optical interconnections as there are second ports.

5. An optical crossbar switch, as recited in claim 4, wherein said each of said splitting means is selected from the group consisting of a y-branch and a t-branch.

6. An optical crossbar switch, as recited in claim 5, wherein said y-branch comprises:
   a) a first semiconductor waveguide having a first end and a second end, said first semiconductor waveguide being significantly larger at said second end than at said first end; and
   b) first and second semiconductor waveguide branches positioned contiguously to said second end of said first semiconductor waveguide, said first semiconductor waveguide branch positioned to diverge from said second semiconductor waveguide branch in a direction away from said second end of said first semiconductor waveguide.

7. An optical crossbar switch, as recited in claim 5, wherein said t-branch comprises:
   a) a first semiconductor waveguide for propagating an optical signal having a first end and a second end, said first semiconductor waveguide being larger at said second end than at said first end;
   b) a beam splitting means positioned at said second end of said first semiconductor waveguide for dividing said first semiconductor waveguide into first and second waveguide branches, said first and second waveguide branches being substantially perpendicular to said first semiconductor waveguide, said first waveguide branch being oppositely directed from said second waveguide branch;
   c) a first turning mirror for redirecting said first waveguide branch in a direction substantially parallel with said first semiconductor waveguide; and
   d) a second turning mirror for redirecting said second waveguide branch in a direction substantially parallel with said first semiconductor waveguide.

8. An optical crossbar switch, as recited in claim 5, wherein said lateral confinement means is a ribbed structure formed from said plurality of semiconductor layers overlying said active layer.

9. An optical crossbar switch, as recited in claim 5, wherein said semiconductor substrate is formed of an alloy of AlGaAs and wherein said plurality of semiconductor layers are formed from alloys of AlGaAs.

10. An optical crossbar switch, as recited in claim 3, further comprising a plurality of splitting means for dividing each semiconductor waveguide, forming each of said second ports, into an equal number of optical interconnections as there are first ports.

11. An optical crossbar switch, as recited in claim 10, wherein said each of said splitting means is selected from the group consisting of a y-branch and a t-branch.

12. An optical crossbar switch, as recited in claim 11, wherein said y-branch comprises:
   a) a first semiconductor waveguide having a first end and a second end, said first semiconductor waveguide being significantly larger at said second end than at said first end; and
   b) first and second semiconductor waveguide branches positioned contiguously to said second end of said first semiconductor waveguide, said first semiconductor waveguide branch positioned to diverge from said second semiconductor waveguide branch in a direction away from said second end of said first semiconductor waveguide.

13. An optical crossbar switch, as recited in claim 11, wherein said t-branch comprises:
   a) a first semiconductor waveguide for propagating an optical signal having a first end and a second end, said first semiconductor waveguide being larger at said second end than at said first end;
   b) a beam splitting means positioned at said second end of said first semiconductor waveguide for dividing said first semiconductor waveguide into first and second waveguide branches, said first and second waveguide branches being substantially perpendicular to said first semiconductor waveguide, said first waveguide branch being oppositely directed from said second waveguide branch;
   c) a first turning mirror for redirecting said first waveguide branch in a direction substantially parallel with said first semiconductor waveguide; and
   d) a second turning mirror for redirecting said second waveguide branch in a direction substantially parallel with said first semiconductor waveguide.

14. An optical crossbar switch, as recited in claim 11, wherein said lateral confinement means is a ribbed structure formed from said plurality of semiconductor layers overlying said active layer.

15. An optical crossbar switch, as recited in claim 11, wherein said semiconductor substrate is formed of an alloy of AlGaAs and wherein said plurality of semiconductor layers are formed from alloys of AlGaAs.

16. An optical crossbar switch, as recited in claim 3, wherein said active layer is comprised of a material selected from the group consisting of InGaAs, InGaAsP, and InAsSb.

17. An optical crossbar switch, as recited in claim 3, wherein said active layer is comprised of a II-VI material.

18. An optical crossbar switch, as recited in claim 3, wherein said lateral confinement means is produced by impurity induced disordering.

19. An optical crossbar switch, as recited in claim 3, wherein said active layer is comprised of one or more quantum wells.

20. An optical crossbar switching network, comprising:
   a) an optical crossbar switch, comprising:
   1) a semiconductor substrate;
   2) a plurality of semiconductor layers, positioned upon said semiconductor substrate, having an active layer therein forming a semiconductor waveguide for propagating optical signals, said active layer having a first semiconductor layer of a first conductive type on a first side and a second semiconductor layer of a second conductive type on a second side, said first and second semiconductor layers having a greater and smaller refractive indices, respectively than said active layer to provide transverse confinement for the optical signals;
   3) interconnection means for connecting multiple sections of the semiconductor wave guide wherein said semiconductor waveguide forms a plurality of first ports and a plurality of second ports, said first and second ports capable of receiving and emitting optical signals, each first port being interconnected via the semiconductor waveguide with every second port; and
   4) a plurality of excitation means positioned along the semiconductor waveguide forming a switching means which interconnect each first port with each second port, each of said excitation means having a first on state in which energy is applied to said excitation means such that said optical signals may be transmitted in the active layer through said semiconductor waveguide underlying said switching means with no loss in signal strength and a second off state in which no energy is applied to said switching means such that said optical signal is significantly attenuated in the portion of said semiconductor waveguide underlying said switching means;

b) a sensing means for detecting a signal impinging on said optical crossbar switch and providing a corresponding output; and c) a controlling means for reconfiguring said optical crossbar switch in response to the output of said sensing means.

* * * * *